(12) United States Patent
Mu et al.

(10) Patent No.: US 10,952,312 B2
(45) Date of Patent: Mar. 16, 2021

(54) COMMUNICATION MODULE PACKAGING

(71) Applicant: Finisar Corporation, Sunnyvale, CA (US)

(72) Inventors: Jianwei Mu, Pleasanton, CA (US); Hongyu Deng, Saratoga, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

(21) Appl. No.: 16/178,507

(22) Filed: Nov. 1, 2018

(65) Prior Publication Data

US 2019/0132941 A1    May 2, 2019

Related U.S. Application Data

(60) Provisional application No. 62/580,253, filed on Nov. 1, 2017.

(51) Int. Cl.
*H05K 1/02* (2006.01)
*H05K 1/11* (2006.01)
(Continued)

(52) U.S. Cl.
CPC .......... *H05K 1/0219* (2013.01); *H01P 3/003* (2013.01); *H01P 3/026* (2013.01); *H01P 5/028* (2013.01);
(Continued)

(58) Field of Classification Search
CPC ...... H05K 1/0219; H05K 1/181; H05K 1/115; H05K 2201/10803; H05K 2201/09236; H05K 2203/049; H05K 1/0298; H05K 2201/09254; H05K 2201/09336; H05K 1/0253; H05K 2201/09618; H05K 2201/09727; H05K 1/0245; H05K 2201/093; H05K 2201/10121; H05K 2201/10015; H05K 2201/10287; H05K 2201/10522; H05K 1/0251; H05K 2201/09627; H05K 1/0216; H05K 1/0227;
(Continued)

(56) References Cited

U.S. PATENT DOCUMENTS

| 5,606,358 A * | 2/1997 | Beaman ...................... B41J 2/45 257/E27.121 |
| 7,983,624 B2 * | 7/2011 | Knecht .................... H04B 1/18 455/550.1 |
| 2013/0235542 A1 * | 9/2013 | Song ....................... H01P 1/047 361/773 |

FOREIGN PATENT DOCUMENTS

WO    2015/0158726 A1    10/2015

OTHER PUBLICATIONS

International Search Report and Written Opinion dated Feb. 12, 2019, in related PCT Application No. PCT/US2018/058676 (15 pages).

(Continued)

*Primary Examiner* — James Wu
(74) *Attorney, Agent, or Firm* — Blank Rome LLP

(57) ABSTRACT

A communication module may include a communication ground layer. The communication module may also include a circuit board. The circuit board may be located proximate the communication ground layer. The circuit board may include a stitch layer. The stitch layer may be electrically coupled to the communication ground layer via a plurality of stitch layer vias. Additionally, the communication module may include multiple ground vias. The ground vias may be electrically coupled to a portion of the circuit board and to the communication ground layer.

20 Claims, 5 Drawing Sheets

(51) Int. Cl.
*H05K 1/18* (2006.01)
*H01P 3/02* (2006.01)
*H01P 5/02* (2006.01)
*H01P 3/00* (2006.01)

(52) U.S. Cl.
CPC ............. *H05K 1/115* (2013.01); *H05K 1/181* (2013.01); *H05K 1/0245* (2013.01); *H05K 1/0253* (2013.01); *H05K 1/0298* (2013.01); *H05K 2201/093* (2013.01); *H05K 2201/09236* (2013.01); *H05K 2201/09254* (2013.01); *H05K 2201/09336* (2013.01); *H05K 2201/09618* (2013.01); *H05K 2201/09727* (2013.01); *H05K 2201/10015* (2013.01); *H05K 2201/10121* (2013.01); *H05K 2201/10287* (2013.01); *H05K 2201/10522* (2013.01); *H05K 2201/10803* (2013.01); *H05K 2203/049* (2013.01)

(58) Field of Classification Search
CPC ....... H05K 1/0228; H01P 3/003; H01P 5/028; H01P 3/026; H01L 2224/49175; H01L 2924/3011; H01L 23/49827; H01L 2223/6616; H01L 2223/6627; H01L 21/486; H01R 13/6461; H01R 13/6471
See application file for complete search history.

(56) References Cited

OTHER PUBLICATIONS

Rohrl Franz Xaver et al: "Wideband RF interconnects for organic chip packages comparison of single ended and differential transitions", 2015 European Microwave Conference (EUMC), EUMA, Sep. 7, 2015 (Sep. 7, 2015), pp. 7 81,-7 84, XP03282297 9, DOI : 10. 1109/EUMC.2015.7345880.

* cited by examiner

COMMUNICATION MODULE PACKAGING

CROSS-REFERENCE TO RELATED APPLICATION

This application claims the benefit of and priority to U.S. Provisional Patent Application No. 62/580,253 filed Nov. 1, 2017, which is incorporated herein by reference.

FIELD

The embodiments discussed herein relate generally to communication modules. More particularly, some example embodiments relate to one or more ground mechanisms to improve signal integrity of high speed communication modules.

BACKGROUND

Unless otherwise indicated herein, the materials described herein are not prior art to the claims in the present application and are not admitted to be prior art by inclusion in this section.

Communication modules, such as optoelectronic transceiver modules, may include various components that engage in the transmission and reception of optical signals. Some of the components may be housed within a shell of the optical transceiver module. Examples of such components may include a transmitter optical subassembly (TOSA) and/or a receiver optical subassembly (ROSA).

An optoelectronic transceiver module may include a transmit port and/or a receive port configured to optically couple to an optical fiber cable. Optical signals may be received and/or transmitted by the optoelectronic transceiver module via the optical fiber cable.

Optical signals received by the optoelectronic transceiver module may be converted to electrical signals. Conversely, the optoelectronic transceiver module may convert electrical signals to optical signals for transmission. During operation, components of the optoelectronic transceiver module may produce and emit electromagnetic fields, or electromagnetic interference (EMI), that may interfere with the operation of other components within and/or external to the optoelectronic transceiver module, particularly while the components operate at high frequencies.

The subject matter claimed herein is not limited to implementations that solve any disadvantages or that operate only in environments such as those described above. Rather, this background is only provided to illustrate one example technology area where some implementations described herein may be practiced.

SUMMARY

A communication module may include a communication ground layer. The communication module may also include a circuit board. The circuit board may be located proximate the communication ground layer. The circuit board may include a stitch layer. The stitch layer may be electrically coupled to the communication ground layer via a plurality of stitch layer vias. Additionally, the communication module may include multiple ground vias. The ground vias may be electrically coupled to a portion of the circuit board and to the communication ground layer.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only example embodiments of the invention and are therefore not to be considered limiting of its scope. The invention will be described and explained with additional specificity and detail through the use of the accompanying drawings in which.

DESCRIPTION OF EMBODIMENTS

Some embodiments described herein relate to optoelectronic transceiver modules and/or other communication modules. More particularly, some embodiments may relate to one or more ground mechanisms configured to be positioned within and/or proximate a circuit board within a high speed box (e.g., a housing, a case, or an Optical Sub-Assembly (OSA) box) located within optoelectronic transceiver modules to reduce interference within the optoelectronic transceiver module.

In some embodiments, optical signals received by the optoelectronic transceiver module may be converted to electrical signals. Conversely, the optoelectronic transceiver module may convert electrical signals to optical signals for transmission. In some embodiments, the optoelectronic transceiver module may include a gold box, a driver, and/or a communication ground layer configured to manipulate the electrical signals.

In some embodiments, the circuit board and/or the driver may be electrically coupled to the communication ground layer via multiple ground vias. In these and other embodiments, both a portion of the circuit board and a portion of the driver may be electrically coupled to the communication ground layer via a first portion of the ground vias. Additionally or alternatively, the circuit board may be electrically coupled to the communication ground layer via a stitch ground layer that is located proximate and between multiple signal traces within the circuit board.

Reference will now be made to the figures wherein like structures will be provided with like reference designations. The drawings are non-limiting, diagrammatic, and schematic representations of example embodiments, and are not necessarily drawn to scale.

Figure 1:
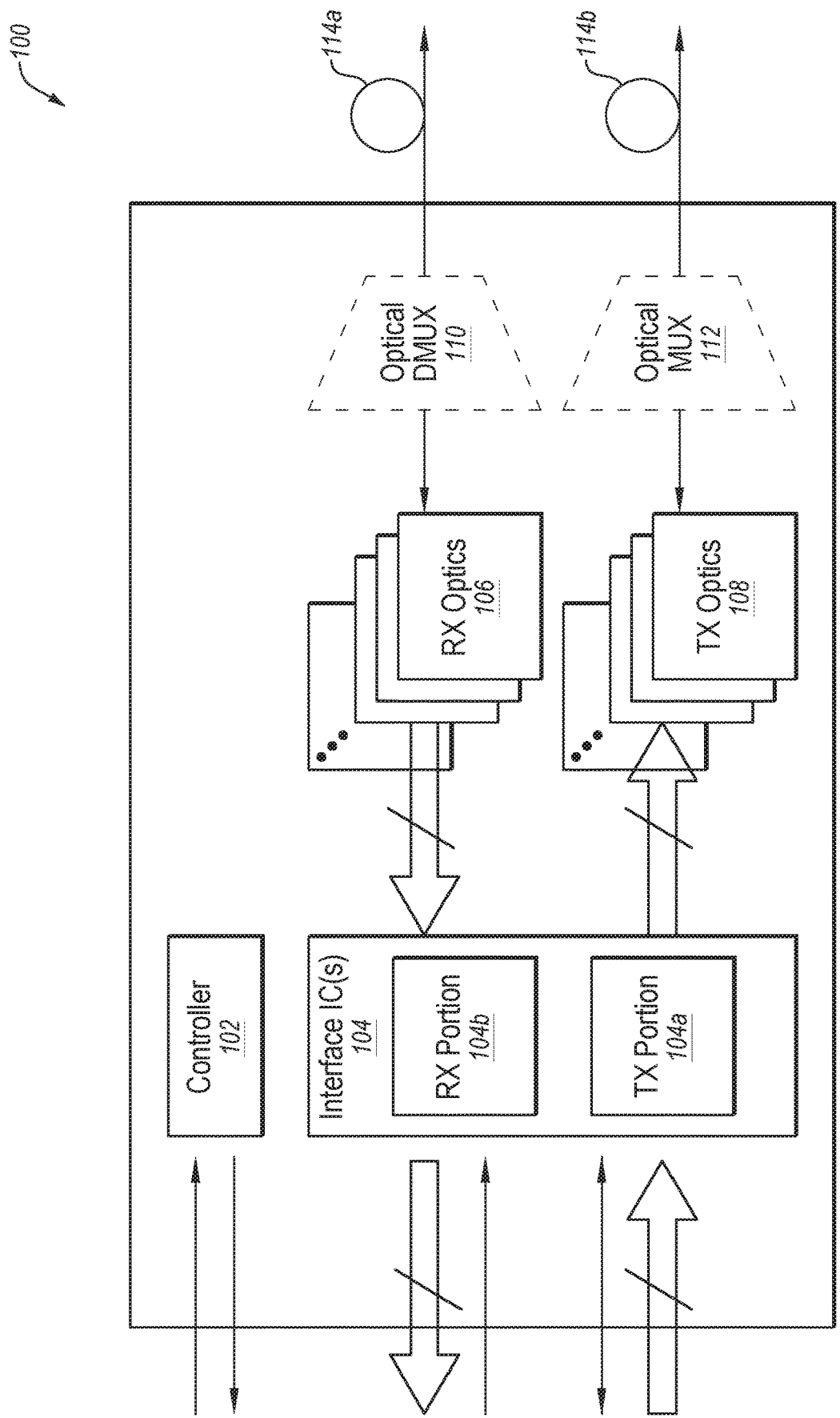
FIG. 1 illustrates an example optoelectronic system.

FIG. 1 illustrates an example optoelectronic system 100 (herein "system 100"), in accordance with at least one embodiment described herein. The system 100 may include a controller 102, an electrical signal module 104, receive components 106, transmit components 108, a demultiplexer 110 (herein "DEMUX 110"), and a multiplexer 112 (herein "MUX 112"). The system 100 may also include a receive fiber optic cable 114*a* and a transmit fiber optic cable 114*b* (collectively "fiber optic cables 114"). The fiber optic cables 114 may include multi-mode fiber (MMF) cables, single mode fiber (SMF) cables, multifiber ribbon cables (in which case the DEMUX 110 and/or MUX 112 may be omitted), or any other suitable optical signal transmission media.

The system 100 may be configured for optical signal transmission and reception at a variety of data rates including, but not limited to, 1.25 Gb/s, 2.125 Gb/s, 2.5 Gb/s, 4.25 Gb/s, 8.5 Gb/s, 10.3 Gb/s, 10.5 Gb/s, 11.3 Gb/s, 14.025 Gb/s, 25 Gb/s, 50 Gb/s, or 100 Gb/s or higher. Furthermore, the system 100 may be configured for optical signal transmission and reception at various wavelengths including, but not limited to, 850 nm, 1310 nm, 1470 nm, 1490 nm, 1510 nm, 1530 nm, 1550 nm, 1570 nm, 1590 nm, or 1610 nm. Further, the system 100 may be configured to support various communication protocols including, but not limited to, Optical Fast Ethernet, Optical Gigabit Ethernet, 10 Gigabit Ethernet, and 1×, 2×, 4×, 8×, and 16× Fibre Channel. In addition, the system 100 may alternatively be configured in a variety of form factors that are substantially compliant with other multi source agreements (MSAs) including, but not limited to, the QSFP MSA, the QSFP+MSA, the CFP MSA, the CFP2 MSA, the CFP4 MSA, the SFP MSA, or the SFP+MSA. The system 100 may be configured as a transmitter optical subassembly (TOSA) and/or a receiver optical subassembly (ROSA).

In some embodiments, the receive fiber optic cable 114a may be optically coupled to the DEMUX 110. In these and other embodiments, the receive fiber optic cable 114a may be configured to provide a first optical signal (e.g., a receive optical signal) to the DEMUX 110. The first optical signal may include multiple data portions. Each of the multiple data portions may include data to be transmitted to an external device.

The DEMUX 110 may be configured to receive the first optical signal. Additionally, the DEMUX 110 may demultiplex (e.g., spatially separate) the first optical signal into one or more intermediate receive optical signals propagating on different signal paths from the output of the DEMUX 110 to the receive components 106. Each intermediate receive optical signal may be representative of and/or may include a different one of the multiple data portions of the first optical signal.

The receive components 106 may be optically coupled to the DEMUX 110 and may include multiple optical receivers (e.g., photodiodes). The receive components 106 may be configured to receive the intermediate receive optical signals. The receive components 106 may be configured to convert the intermediate receive optical signals into intermediate receive electrical signals. Each of the intermediate receive electrical signals may be representative of a different intermediate receive optical signal (e.g., a different data portion of the first optical signal).

The electrical signal module 104 may include a transmit portion 104a and/or a receive portion 104b. The receive portion 104b of the electrical signal module 104, which may be electrically coupled to the receive components 106, may include multiple receive channels configured to receive and manipulate the intermediate receive electrical signals. Additionally, the receive portion 104b of the electrical signal module 104 may be configured to manipulate the intermediate receive electrical signals to provide manipulated intermediate receive electrical signals to an external device. For example, an Ethernet cable may be electrically coupled to the receive portion 104b of the electrical signal module 104, the receive portion 104b may provide the manipulated intermediate receive electrical signals to the Ethernet cable. Each channel in the receive portion 104b may include and/or may be coupled to one or more of a pre-amplifier, a post-amplifier, a trans-impedance amplifier (TIA), a clock and data recovery (CDR) circuit, an equalizer, and/or any other suitable device.

The transmit portion 104a of the electrical signal module 104 may be electrically coupled to the transmit components 108. Additionally, the transmit portion 104a of the electrical signal module 104 may include multiple transmit channels, each of which may include and/or may be electrically coupled to one or more of a CDR, an equalizer, a driver or any other suitable device. Each of the transmit channels of the transmit portion 104a may be configured to receive and manipulate one or more intermediate transmit electrical signals from the external device. Additionally, the transmit portion 104a may be configured to provide the manipulated intermediate transmit electrical signals to the transmit components 108. Each of the manipulated intermediate transmit electrical signals may include, e.g., a modulation signal which, when applied to an optical signal source, may cause the optical signal source to emit an optical signal representative of the corresponding intermediate transmit electrical signal.

The transmit components 108 may be electrically coupled to the transmit portion 104a of the electrical signal module 104 and may include multiple optical signal sources (e.g., lasers). The transmit components 108 may be configured to receive the manipulated intermediate transmit electrical signals. The transmit components 108 may also be configured to convert the manipulated intermediate transmit electrical signals into intermediate transmit optical signals. Each of the intermediate transmit optical signals may be representative of a different intermediate transmit electrical signal.

The MUX 112 may be optically coupled to the transmit components 108. In some embodiments, the MUX 112 may be configured to receive the intermediate transmit optical signals received on different signal paths. Additionally, the MUX 112 may multiplex (e.g., spatially combine) the intermediate transmit optical signals from the different signal paths into a second optical signal on a single signal path. The second optical signal may include multiple portions in which each portion of the second optical signal may be representative of a different intermediate transmit optical signal. Furthermore, the MUX 112 may be optically coupled to the transmit fiber optic cable 114b. The MUX 112 may provide the second optical signal to an external device via the transmit fiber optic cable 114b.

The controller 102 may be configured to monitor the system 100. For example, the controller 102 may monitor the data rate of the different optical signals and/or electrical signals within the system 100. In some embodiments, the controller 102 may provide notification if the system 100 is not operating properly. Additionally, the controller 102 may receive instructions to modify performance of the system 100. For example, the controller 102 may receive instructions to change the rate for combining or separating the first optical signal and/or the second optical signal.

Figure 2:
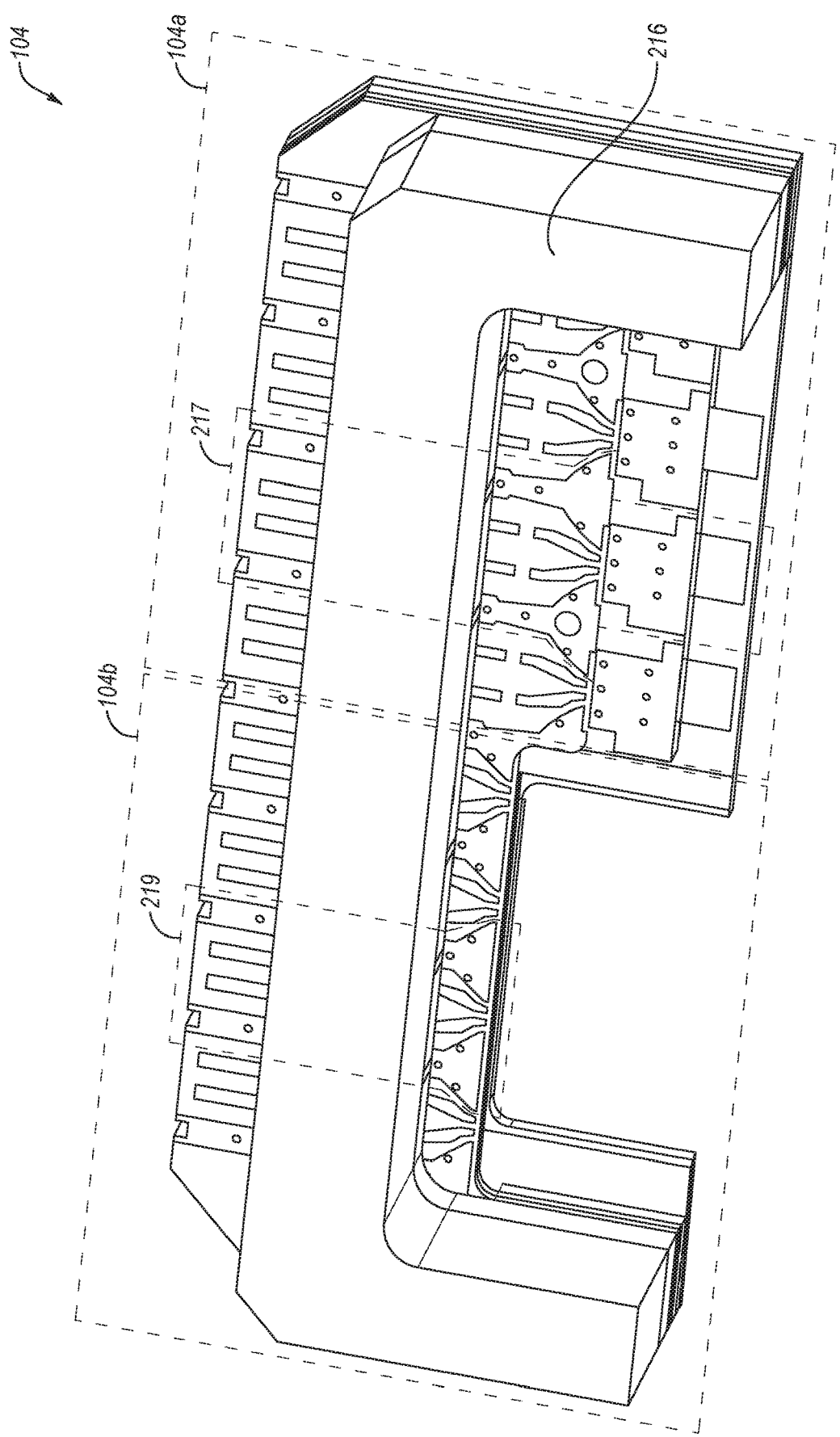
FIG. 2 is a top perspective view of a portion of an electrical signal module that may be implemented in the optoelectronic system of FIG. 1.

FIG. 2 is a top perspective view of a portion of the electrical signal module 104 that may be implemented in the optoelectronic system 100 of FIG. 1, in accordance with at least one embodiment described herein. In some embodiments, the electrical signal module 104 may include the receive portion 104b and the transmit portion 104a.

In some embodiments, the receive portion 104b may include one or more components to receive electrical signals. In these and other embodiments, the receive portion 104b may include one or more receive channels 219, which may include one or more signal traces, one or more capacitors, and/or one or more ground traces. One or more of the foregoing elements of each of the receive channels 219 may form a corresponding radio frequency (RF) feedthrough of the corresponding receive channel 219 that carries receive electrical signals through an enclosure 216, e.g., a box or housing of the electrical signal module 104. In FIG. 2, a single receive channel 219 is numbered and described for simplicity of discussion.

In some embodiments, each of the electrical signals received by the receive channels 219 may be representative of a different portion of an optical signal transmitted by an external device. Additionally or alternatively, each of the receive channels 219 may be configured to receive one or more electrical signals representative of a portion of the optical signal.

In some embodiments, the transmit portion 104a may include one or more components for generating and transmitting electrical signals to be converted and combined into one or more optical signals. In these and other embodiments, the transmit portion 104a may include one or more transmit channels 217, which may include one or more signal traces, one or more ground traces, one or more capacitors, and/or a driver. One or more of the foregoing elements of each of the transmit channels 217 may form a corresponding RF feedthrough that carries transmit electrical signals through the enclosure 216 of the electrical signal module 104. In FIG. 2, a single transmit channel 217 is numbered and described for simplicity of discussion. The transmit channel 217 is discussed in more detail below in relation to FIGS. 3A and 3B.

In some embodiments, the electrical signal module 104 may include multiple communication modules. In these and other embodiments, the communication modules may include the receive channels 219 and the transmit channels 217. Additionally or alternatively, each of the communication modules that include the transmit channel 217 may be configured according to the transmit channel 217 discussed below in relation to FIG. 3B.

Figure 3A:
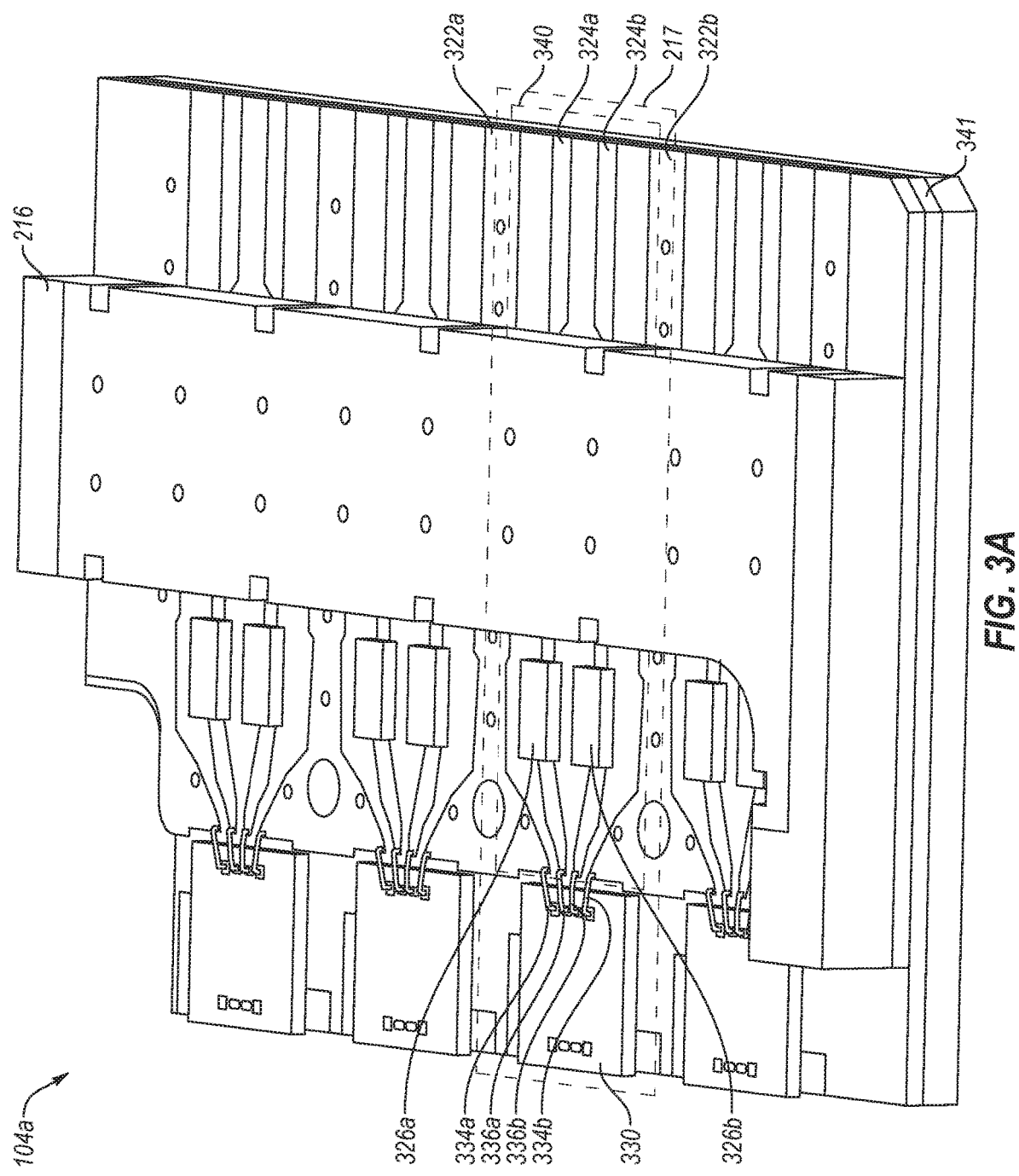
FIG. 3A is a top perspective view of the transmit portion of FIGS. 1 and 2 with multiple transmit channels.

FIG. 3A is a top perspective view of the transmit portion 104a of FIGS. 1 and 2 with multiple transmit channels 217 (only one is labeled in FIG. 3A for simplicity), in accordance with at least one embodiment discussed herein. The transmit portion 104a of FIG. 3A includes multiple integrated circuits (ICs) 330 (only one is labeled in FIG. 3A for simplicity), specifically multiple drivers in this example, as well as various ceramic layers 341 on, within, and/or through which various other components of each of the transmit channels 217 is positioned and/or formed. A portion of the enclosure 216 is also depicted in FIG. 3A. In FIG. 3A, a single transmit channel 217 and its components are numbered and described for simplicity of discussion without numbering other transmit channels 217 and their components in FIG. 3A.

Figure 3B:
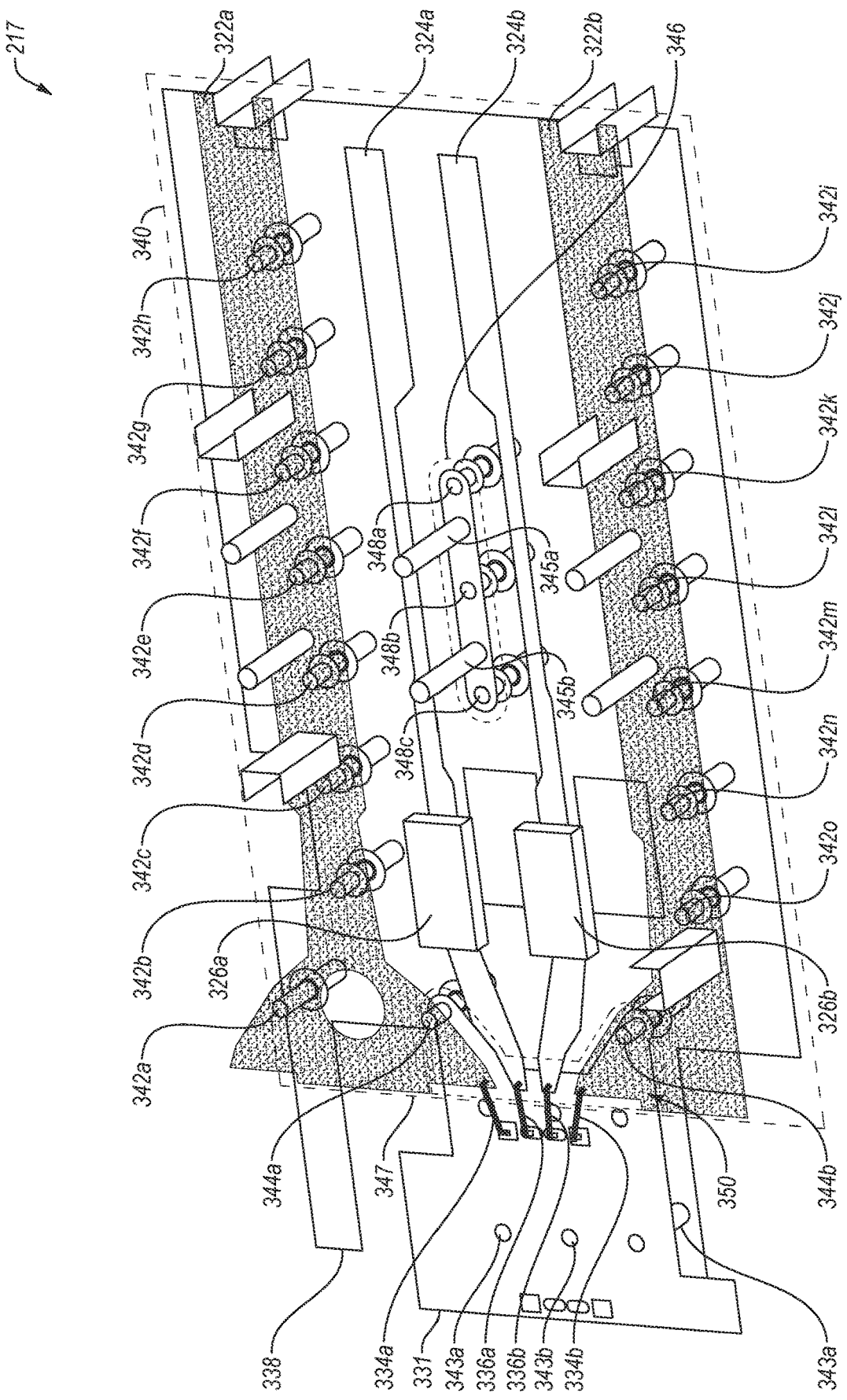
FIG. 3B is a top perspective view of one of the transmit channels of FIG. 3A that may be implemented in the electrical signal module of FIG. 2.

FIG. 3B is a top perspective view of one of the transmit channels 217 of FIG. 3A that may be implemented in the electrical signal module 104 of FIG. 2, in accordance with at least one embodiment discussed herein. In FIG. 3B, the IC 330 and one or more ceramic layers of the transmit channel 217 have been omitted for clarity in depicting other components of the transmit channel 217. Additionally, the transmit channel 217 may be implemented as each of the multiple transmit channels 217 illustrated in FIGS. 2 and 3A.

Referring to FIGS. 3A and 3B, each of the transmit channels 217 may include an IC 330 (not visible in FIG. 3B) (e.g., a driver in the case of the transmit channel 217 or other IC such as a TIA in the case of a receive channel), a circuit board 340 that includes one or more ceramic layers 341 (not visible in FIG. 3B), and a communication ground layer 338 (not visible in FIG. 3A). Each of the ICs 330 may be mounted on and/or coupled to a corresponding IC ground 331 (not visible in FIG. 3A). The IC ground 331 may include copper or other suitable material. The IC 330 may be electrically coupled to downstream components of the transmit channel 217 via a first ground wire bond 334a and a second ground wire bond 334b (collectively "ground wire bonds 334") and a first signal wire bond 336a and a second signal wire bond 336b (collectively "signal wire bonds 336"). The first ground wire bond 334a, the second ground wire bond 334b, the first signal wire bond 336a, and the second signal wire bond 336b are illustrated as wire bonds in FIGS. 3A and 3B for example purposes only. It is understood that the first ground wire bond 334a, the second ground wire bond 334b, the first signal wire bond 336a, and the second signal wire bond 336b may be replaced with flip-chip bonding or any other appropriate IC connection technology. The circuit board 340 may include a first capacitor 326a and a second capacitor 326b (collectively "capacitors 326"). The circuit board 340 may also include a first circuit board signal trace 324a and a second circuit board signal trace 324b (collectively "circuit board signal traces 324"). Additionally, the circuit board 340 may include a first circuit board ground trace 322a and a second circuit board ground trace 322b (collectively "circuit board ground traces 322"). In FIG. 3B, the circuit board ground traces 322 are depicted as transparent to permit components beneath them to be seen, although the circuit board ground traces 322 may or may not be transparent in actual implementation. Furthermore, the circuit board 340 may include a stitch layer 346.

In some embodiments, the circuit board 340 may be located (e.g., housed) at least partially within the enclosure 216, which enclosure 216 may include a box such as a high speed box (e.g., a housing, a case, or an Optical Sub-Assembly (OSA) box). The enclosure 216 may be located within an optoelectronic transceiver module to reduce interference within the optoelectronic transceiver module. In particular, the enclosure 216 may reduce and/or eliminate interference generated by components within the enclosure 216 from affecting components outside the enclosure, and/or vice versa.

With continued reference to FIGS. 3A and 3B, the IC 330 may be located proximate the circuit board 340. Additionally, the IC 330 may be located proximate the communication ground layer 338. In some embodiments, the IC 330 may be located along a first edge 347 of the circuit board 340. In these and other embodiments, the ground wire bonds 334 may be electrically coupled to the circuit board ground traces 322. In some embodiments, the IC ground 331 may be electrically coupled to the communication ground layer 338 through one or more IC ground vias (e.g., a first IC ground via 343a, a second IC ground via 343b, and a third IC ground via 343c (collectively "IC ground vias 343")).

In some embodiments, each of the ground wire bonds 334 may be electrically coupled to a different circuit board ground trace 322. For example, the first ground wire bond 334a may be electrically coupled to the first circuit board ground trace 322a. As another example, the second ground wire bond 334b may be electrically coupled to the second circuit board ground trace 322b. In these and other embodiments, each of the circuit board signal traces 324 may be electrically coupled to a different signal wire bond 336. For example, the first signal wire bond 336a may be electrically coupled to the first circuit board signal trace 324a. As another example, the second signal wire bond 336b may be electrically coupled to the second circuit board signal trace 324b.

The circuit board 340 may be located proximate the communication ground layer 338 and/or may include the communication ground layer 338. In some embodiments, the circuit board 340, and specifically the circuit board ground traces 322 of the circuit board 340, may be electrically coupled to the communication ground layer 338 through multiple ground vias (e.g., a first ground via 42a, second ground via 342b, a third ground via 342c, a fourth ground via 342d, a fifth ground via 342e, a sixth ground via 342f, a seventh ground via 342g, an eighth ground via 342h, a ninth ground via 342i, a tenth ground via 342j, an eleventh ground via 342k, a twelfth ground via 342l, a thirteenth ground via 342m, a fourteenth ground via 342n, and a fifteenth ground via 342o (collectively "ground vias 342")).

In some embodiments, an extended IC ground portion 350 of the IC ground 331 may extend beyond the first edge 347 of the circuit board 340. The extended IC ground portion 350 may be electrically coupled to the circuit board ground traces 322 in such a manner that at least a portion of the circuit board ground traces 322, the extended IC ground portion 350, and the IC ground 331 are electrically coupled to the communication ground layer 338 through a first extended IC ground via 344a and a second extended IC ground via 344b (collectively "extended IC ground vias 344"). Additionally, the stitch layer 346 may be electrically coupled to the communication ground layer 338 through a first stitch layer via 348a, a second stitch layer via 348b, and a third stitch layer via 348c (collectively "stitch layer vias 348").

The extended IC ground portion 350 may reduce signal interference discontinuity as electrical signals propagate along the circuit board signal traces 324. For example, the extended IC ground portion 350 may reduce impedance mismatch between the IC 330 and the circuit board 340 (via the extended IC ground portion 350). The impedance mismatch between the circuit board 340 and the IC 330 may be reduced since both the circuit board 340 and the IC 330 are electrically coupled to the communication ground layer 338 through the extended IC ground vias 344. Additionally, return loss due to the interface discontinuity may be decreased by the extended IC ground portion 350. Moreover, the extended IC ground portion 350 may also improve signal integrity by enhancing EMI performance of the transmit channel 217 and the electrical signal module 104.

The capacitors 326, which may be electrically coupled in series with the circuit board signal traces 324, may be configured as a direct current (DC) signal filter. For example, the capacitors 326 may filter out DC portions of the electrical signals so that only AC portions of the electrical signals are provided by the transmit channel 217.

The stitch layer 346 may improve isolation of the circuit board signal traces 324. For example, the stitch layer 346 may reduce cross talk between the circuit board signal traces 324. In some embodiments, the circuit board signal traces 324 may radiate when charged by the electrical signals. Additionally or alternatively, the stitch layer 346 may improve impedance matching of the circuit board signal traces 324. The stitch layer 346 may allow impedance matching between the signal wire bonds 336 and the circuit board signal traces 324. The stitch layer 346 may also enhance signal integrity by decreasing EMI due to a wider physical gap existing between the circuit board signal traces 324 along at least a portion of the length of the circuit board signal traces than transmit channels that do not include the stitch layer 346. Also, the stitch layer 346 may reduce parasitic effects by connecting the communication ground layer 338 to the enclosure 216 through multiple enclosure vias (e.g., a first enclosure via 345a and a second enclosure via 345b). In some embodiments, the enclosure 216 may include metal to reduce EMI.

In some embodiments, a sequence of traces in the circuit board 340 may be ground trace, signal trace, ground trace, signal trace, and ground trace. For example, in the circuit board 340, the sequence of traces may be the first circuit board ground trace 322a, the first circuit board signal trace 324a, the stitch layer 346, the second circuit board signal trace 324b, and the second circuit board ground trace 322b.

In some embodiments, at least some of the circuit board ground traces 322 may be used to electrically couple two or more transmit channels 217 to the communication ground layer 338 via the ground vias 342.

Figure 4:
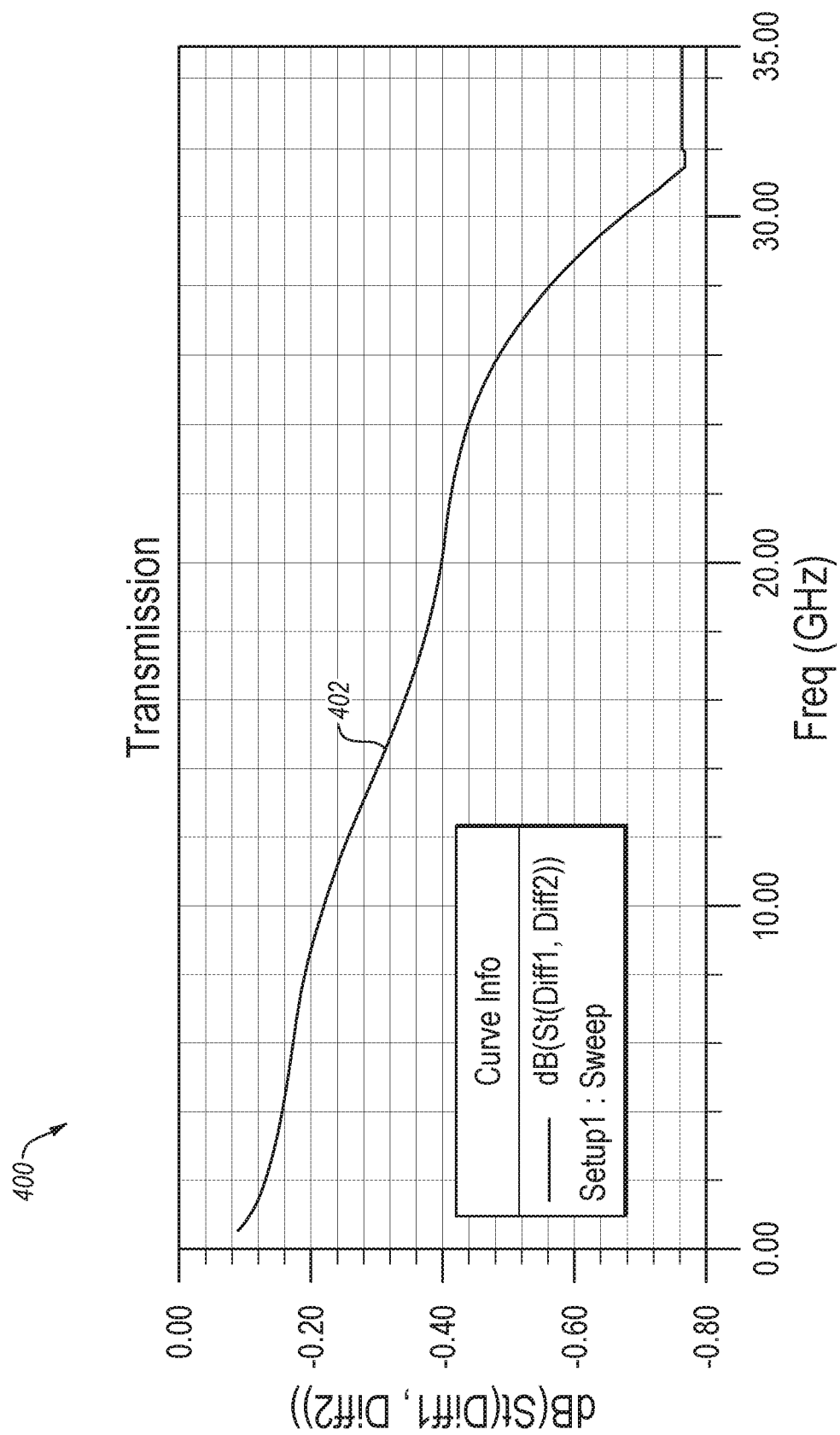
FIG. 4 includes a graphical representation of a simulation showing signal strength as a function of frequency of an electrical signal transmitted by the electrical signal module of FIG. 2.

FIG. 4 includes a graphical representation 400 of a simulation showing signal strength as a function of frequency of an electrical signal transmitted by the electrical signal module 104 of FIG. 2, in accordance with at least one embodiments described herein. A curve 402 represents the signal strength of the electrical signal as a function of the frequency of the electrical signal.

In the simulation represented in graphical representation 400, the curve 402 represents the channel transmission performance as functions of frequency. The curve 402 shows that insertion loss may be reduced so as to be as low as about 0.4 decibels (dB) at a frequency of about 20 gigahertz (GHz). Also, the electrical signal module 104 implementing the extended IC ground portion 350 and/or the stitch layer 346 may reduce/eliminate resonance peak/ripple at frequencies below about 35 GHz.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A communication module comprising:
    a communication ground layer;
    a circuit board located proximate the communication ground layer, the circuit board including:
        a stitch layer electrically coupled to the communication ground layer via a plurality of stitch layer vias; and
        two circuit board signal traces that are spaced apart from and extend along opposite sides of the stitch layer along an entire length of the stitch layer;
    a plurality of ground vias electrically coupled to a portion of the circuit board and to the communication ground layer;
    an enclosure within which at least some components of the communication module are positioned; and
    one or more enclosure vias that electrically couple the stitch layer to the enclosure.

2. The communication module of claim 1, the communication module further comprising an integrated circuit (IC) ground electrically coupled to the communication ground layer via a plurality of IC ground vias, the IC ground including an extended IC ground portion that extends beyond the first edge of the circuit board and is electrically coupled to a portion of the circuit board and the communication ground layer via a plurality of extended IC ground vias.

3. The communication module of claim 2, the communication module further comprising an IC electrically coupled to the IC ground and located proximate the communication ground layer and adjacent the first edge of the circuit board.

4. The communication module of claim 3, the extended IC ground portion configured to reduce signal interference discontinuity by reducing impedance mismatch between the IC and the circuit board.

5. The communication module of claim 3, the communication module further comprising:
    a plurality of signal wire bonds that electrically couple the IC to the plurality of circuit board signal traces; and
    a plurality of ground wire bonds that electrically couple the IC to the circuit board,
    wherein the circuit board further includes a plurality of circuit board ground traces electrically coupled to the communication ground layer via the plurality of ground vias and electrically coupled to the IC via the plurality of ground wire bonds.

6. The communication module of claim 5, the stitch layer configured to enhance signal integrity by enhancing isolation of the circuit board signal traces.

7. The communication module of claim 5, the circuit board further comprising a plurality of capacitors, wherein each capacitor is electrically coupled in series to a circuit board signal trace.

8. The communication module of claim 5, wherein a sequence of traces of the circuit board comprises a ground trace, a signal trace, a ground trace, a signal trace, and a ground trace.

9. The communication module of claim 8, wherein the sequence of traces of the circuit board comprises a first circuit board ground trace, a first circuit board signal trace, the stitch layer, a second circuit board signal trace, and a second circuit board ground trace.

10. The communication module of claim 1, wherein a portion of the circuit board is located within the enclosure, the enclosure configured to provide electromagnetic interference shielding of the portion of the circuit board.

11. An electrical signal module comprising a plurality of the communication module of claim 5.

12. A communication module comprising:
a communication ground layer;
a circuit board located proximate the communication ground layer, the circuit board including:
a stitch layer electrically coupled to the communication ground layer via a plurality of stitch layer vias; and
two circuit board signal traces that are spaced apart from and extend along opposite sides of the stitch layer along an entire length of the stitch layer;
an IC ground that includes a first portion electrically coupled to the communication ground layer via a plurality of IC ground vias, the IC ground further including an extended IC ground portion that extends continuously from and coplanar with the first portion beyond a first edge of the circuit board, wherein the extended IC ground portion is electrically coupled to a portion of the circuit board and the communication ground layer via a plurality of extended IC ground vias; and
a plurality of ground vias electrically coupled to a portion of the circuit board and to the communication ground layer.

13. The communication module of claim 12, further comprising:
an enclosure within which at least some components of the communication module are positioned; and
one or more enclosure vias that electrically couple the stitch layer to the enclosure.

14. The communication module of claim 13, the communication module further comprising:
a plurality of signal electrical connectors that electrically couple the IC to the circuit board, the two circuit board signal traces electrically coupled to the IC via the plurality of signal electrical connectors; and
a plurality of ground electrical connecters that electrically couple the IC to the circuit board,
the circuit board further including a plurality of circuit board ground traces electrically coupled to the communication ground layer via the plurality of ground vias and electrically coupled to the IC via the plurality of ground electrical connectors.

15. The communication module of claim 14, the circuit board further comprising a plurality of capacitors, wherein each capacitor is electrically coupled in series to a circuit board signal trace and wherein at least a portion of the circuit board is located within an enclosure, the enclosure configured to provide electromagnetic interference shielding of the IC and the at least the portion of the circuit board.

16. A communication module comprising:
a communication ground layer;
a plurality of signal wire bonds, a plurality of ground wire bonds, and a plurality of ground vias;
an IC located proximate the communication ground layer and electrically coupled to a circuit board via the plurality of signal wire bonds and the plurality of ground wire bonds;
the circuit board located proximate the communication ground layer and the IC, the circuit board including:
a plurality of circuit board signal traces, wherein each circuit board signal trace of the plurality of circuit board signal traces is electrically coupled to the IC via a corresponding signal wire bond of the plurality of signal wire bonds;
a plurality of circuit board ground traces electrically coupled to the communication ground layer via the plurality of ground vias, wherein each circuit board ground trace of the plurality of circuit board ground traces is electrically coupled to the IC via a corresponding ground wire bond of the plurality of ground wire bonds and wherein each circuit board ground trace is spaced apart from and extends lengthwise along an entire length of a corresponding one of the plurality of circuit board signal traces; and
a stitch layer electrically coupled to the communication ground layer via a plurality of stitch layer vias, wherein the plurality of circuit board signal traces includes two circuit board signal traces that are spaced apart from and extend along opposite sides of the stitch layer along an entire length of the stitch layer and beyond terminal ends of the stitch layer; and
an IC ground located proximate the IC, the IC ground electrically coupled to the IC, the IC ground including a first portion electrically coupled to the communication ground layer via a plurality of IC ground vias, the IC ground further including an extended IC ground portion that extends continuously from and coplanar with the first portion beyond a first edge of the circuit board, wherein the extended IC ground portion is electrically coupled to the circuit board ground traces and the communication ground layer via a plurality of extended IC ground vias.

17. The communication module of claim 16, wherein a sequence of traces of the circuit board comprises a first circuit board ground trace, a first circuit board signal trace, the stitch layer, a second circuit board signal trace, and a second circuit board ground trace.

18. The communication module of claim 16, wherein a portion of the circuit board is located within an enclosure, the enclosure configured to provide electromagnetic interference shielding of the portion of the circuit board.

19. The communication module of claim 16, the circuit board further comprising a plurality of capacitors, wherein each capacitor is electrically coupled in series to a corresponding circuit board signal trace of the plurality of circuit board signal traces.

20. An electrical signal module comprising a plurality of the communication module of claim 16.

* * * * *